United States Patent [19]
Hossain et al.

[11] Patent Number: 5,953,236
[45] Date of Patent: *Sep. 14, 1999

[54] METHOD AND APPARATUS FOR IMPLEMENTING ENGINEERING CHANGE ORDERS IN INTEGRATED CIRCUIT DESIGNS

[75] Inventors: Moazzem Hossain, San Jose; Bala Thumma, Milpitas; Sunil Ashtaputre, San Jose, all of Calif.

[73] Assignee: VLSI Technology, Inc., San Jose, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/550,848

[22] Filed: Oct. 31, 1995

[51] Int. Cl.⁶ .............................. G06F 17/00; G06F 17/50
[52] U.S. Cl. ..................... 364/491; 364/490; 364/489; 364/488
[58] Field of Search ..................... 364/488–491, 364/578

[56] References Cited

U.S. PATENT DOCUMENTS

| | | | |
|---|---|---|---|
| 4,964,057 | 10/1990 | Yabe | 364/491 |
| 5,111,413 | 5/1992 | Lazansky et al. | 364/578 |
| 5,164,907 | 11/1992 | Yabe | 364/491 |
| 5,237,514 | 8/1993 | Curtin | 364/490 |
| 5,396,435 | 3/1995 | Ginetti | 364/489 |
| 5,461,576 | 10/1995 | Tsay et al. | 364/490 |
| 5,550,748 | 8/1996 | Xiong | 364/488 |
| 5,557,533 | 9/1996 | Koford et al. | 364/491 |
| 5,587,923 | 12/1996 | Wang | 364/490 |
| 5,638,291 | 6/1997 | Li et al. | 364/490 |
| 5,666,290 | 9/1997 | Li et al. | 364/491 |

OTHER PUBLICATIONS 1.132 Affidavit and Software Release Notes, Physical Design Tools V8R4.6.5 Beta, Nov. 14, 1994, Compass Design Automation, San Jose, CA.

Software Release Notes, Physical Design Tools V8R4.6.5 Beta, Nov. 14, 1994, Compass Design Automation, San Jose, CA.

Primary Examiner—Kevin J. Teska
Assistant Examiner—Vuthe Siek
Attorney, Agent, or Firm—Hickman Stephens & Coleman, LLP

[57] ABSTRACT

A method for laying out an integrated circuit design based upon a netlist provided by a behavioral synthesis tool includes the steps of: (a) placing cells specified by the netlist in a layout area in a placement step, the cells including pins that are interconnected by nets; (b) verifying timing constraints in a timing verification step of the placed cells in the layout area; and (c) if the timing verification step indicates that timing does not verify in that the timing constraints are not met: (i) modifying the netlist pursuant to an engineering change order (ECO); and (ii) making an ECO placement of at least one cell into the layout area based upon the timing constraints while adjusting any affected nets as specified by the netlist. A layout tool implements the method on a computer system to form a portion of and integrated circuit fabrication system.

21 Claims, 8 Drawing Sheets

METHOD AND APPARATUS FOR IMPLEMENTING ENGINEERING CHANGE ORDERS IN INTEGRATED CIRCUIT DESIGNS

DESCRIPTION

1. Technical Field

This invention relates generally to the design of integrated circuits and more particularly to the automated design of integrated circuits by behavioral synthesis.

2. Background Art

Over the past several decades, integrated circuits (ICs) have become an integral part of modem electrical devices. Rather than using "off-the-shelf" components, it is often desirable to use custom or semi-custom ICs. To permit easier circuit design of custom or semi-custom ICs to fulfill specific performance constraints or circuit requirements and to aid in circuit fabrication, automated systems for design and manufacturing have been developed. Automated design systems are also widely used to design highly complex ICs and ICs having short life cycles.

One type of computer aided design (CAD) system is known as a "behavioral synthesis system." With such a system, the inputs, outputs and other circuit parameters are input into a computer using a hardware description language (HDL). Behavioral synthesis software then designs a circuit meeting these parameters.

A typical integrated circuit design and manufacturing process using behavioral synthesis begins with certain performance or structural constraints. A description of these constraints is made using an HDL such as VHDL or VERILOG which are commercially available behavioral synthesis languages. This HDL can be manipulated to form a "netlist" (i.e. a list of "nets") specifying components and their interconnections which meet the circuit constraints. However, the actual placement plan of components on wafers and the topography of the wiring connections is reserved for a subsequent "layout" stage.

A conventional method 10 for fabricating an integrated circuit is outlined in a flowchart in FIG. 1 beginning at a step 12. In a step 14, a set of circuit specifications is developed. Generally, these specifications can include the overall integrated circuit performance and also specific size and placement characteristics of components on a chip.

A circuit designer will create a description of these specifications in a step 16 using a hardware description language (HDL). Common hardware description languages include the aforementioned VHDL and VERILOG although any suitable language (such as a proprietary HDL) can be used. The HDL description of the specifications is then used in a step 18 to synthesize a netlist. The netlist can also be described in the hardware description language (HDL). A step 20 verifies the behavior and functionality of the netlist, and allows for the repeating of steps 16 and 18 if the behavior and functionality do not meet specifications.

As noted above, the netlist specifies which components (known as "cells") will be connected but does not specify the precise wiring topography. A cell has one or more "pins" for interconnection with pins of other cells. The "netlist" therefore includes "nets" which define the connectivity between pins of the cells. In other words, a "net" is a set of electrically equivalent pins of a number of cells, which must be connected together to form a common electrical node. Components or cells described by the netlist will form a circuit satisfying the circuit specifications.

Further referring to the conventional process of FIG. 1, the circuit designer transfers the verified netlist description into a layout tool in a step 24. The layout step 24 performed by the layout tool determines the actual physical placement of cells on the "layout area" of integrated circuit die or chip to form an array of gates or standard cells. The "layout area" is the area designated for the active components of the IC. The "placement" step of the layout process is extremely time consuming, as it can take several days of computation on a computer workstation for ICs having several hundred thousands of gates. The actual routing of connections or "wires" between pins of the cells is also determined in layout step 24.

Caltech Intermediate Format (C.I.F.) data created in the step 24 is transferred in a step 26 to a mask fabrication tool where an integrated circuit mask is created. This mask will be used to create the integrated circuit chip or die. This mask is generated on a machine equipped to read C.I.F. data. This C.I.F. data can be transferred to this machine through a hard disk, magnetic tape, a floppy disk, or other transmission medium. It is also possible for the mask generating machine to be part of or the same machine that synthesizes the netlist.

An integrated circuit is produced in a step 28. A conventional method of producing the circuit is to use the mask created in step 26 in photolithography processes. Once the chip itself has been fabricated, the integrated circuit on the die must have connections to external circuitry. This is generally accomplished by attaching bonding wires and/or lead frames to the integrated circuit. The circuit is then encapsulated in packaging materials such as plastic. The design and fabrication of the integrated circuit is completed at this point, as indicated at 30.

After the placement, if some of the constraints, such as timing requirements, are not met, the designer may change the netlist by adding some new cells (i.e. components) into the netlist or by replacing some of the existing cells by, typically, bigger cells. The problem encountered in the prior art is how to place the new or modified cells on the layout area such that the original placement of the other cells are minimally disturbed and the timing requirements are met. This problem is called ECO (Engineering Change Order) placement problem. In particular, it is hoped that the ECO will not require the placement step to be repeated because, as mentioned above, it is extremely time consuming.

Although the problem of ECO placement is very well-known and important in VLSI physical design, not much research has been done in this area At the present time, there is no known published research work on the problem. Traditionally, ECO placement problem has been addressed using a very simple heuristic approach. Some of the industry tools use this simple approach to do the ECO placement. The heuristic works as follows:

(i) For gate array designs, try to place each new or changed cell in an empty base site close to a cell that shares a common net. If no such site found, place it in any empty legal site.

(ii) For standard cell designs, place each new cell at the end of a row with smaller row length. For each changed cell, place it in the same row and location by "pushing aside" (if necessary) the rest of the cells in the row so as to remove overlap of cells.

As noted above, the main objective of the ECO placement is to meet the timing requirements of circuits. The above mentioned heuristic approaches of the prior art, however, does not take the timing constraints into consideration. It is only with good luck that the ECO placements using the heuristics of the prior art would accomplish the desired timing constraints. This could require a completely new iteration of the layout process (including the placement step) with many days of lost time.

DISCLOSURE OF THE INVENTION

A method in accordance with the present invention for laying out an integrated circuit design based upon a netlist provided by a behavioral synthesis tool includes the steps of: (a) placing cells specified by the netlist in a layout area in a placement step, the cells including pins that are interconnected by nets; (b) verifying timing constraints in a timing verification step of the placed cells in the layout area; and (c) if the timing verification step indicates that timing does not verify in that the timing constraints are not met: (i) modifying the netlist pursuant to an engineering change order (ECO); and (ii) making an ECO placement of at least one cell into the layout area based upon the timing constraints while adjusting any affected nets as specified by the netlist. A layout tool of the present invention implements the above-described process on a general purpose computer system to form a portion of an integrated circuit fabrication process for the manufacture of custom, semi-custom, complex, short life-cycle, and other types of integrated circuits.

The present invention provides an improved, automated method and apparatus for ECO placement that takes into account timing constraints. It is therefore a major advantage of the present invention that the resulting "ECO placement tool" does not require that the entire layout process (including cell placement) to be repeated to meet timing constraints. A faster ECO placement tool can significantly reduce the over-all physical design cycle, since the designer does not have to iterate through the placement process many times to get a good quality output. As noted above, this is a very major improvement because an IC with several hundred thousand components can take days to execute each iteration of the placement process.

Another advantage of the present invention is that the ECO placement tool produces good quality placement by placing the cells such that the total net length is minimized. This not only helps in meeting timing constraints, but also helps with the overall quality and performance of the layout.

These and other advantages of the present invention will become apparent upon reading the following detailed descriptions and studying the various figures of the drawings.

BEST MODES FOR CARRYING OUT THE INVENTION

Figure 1:
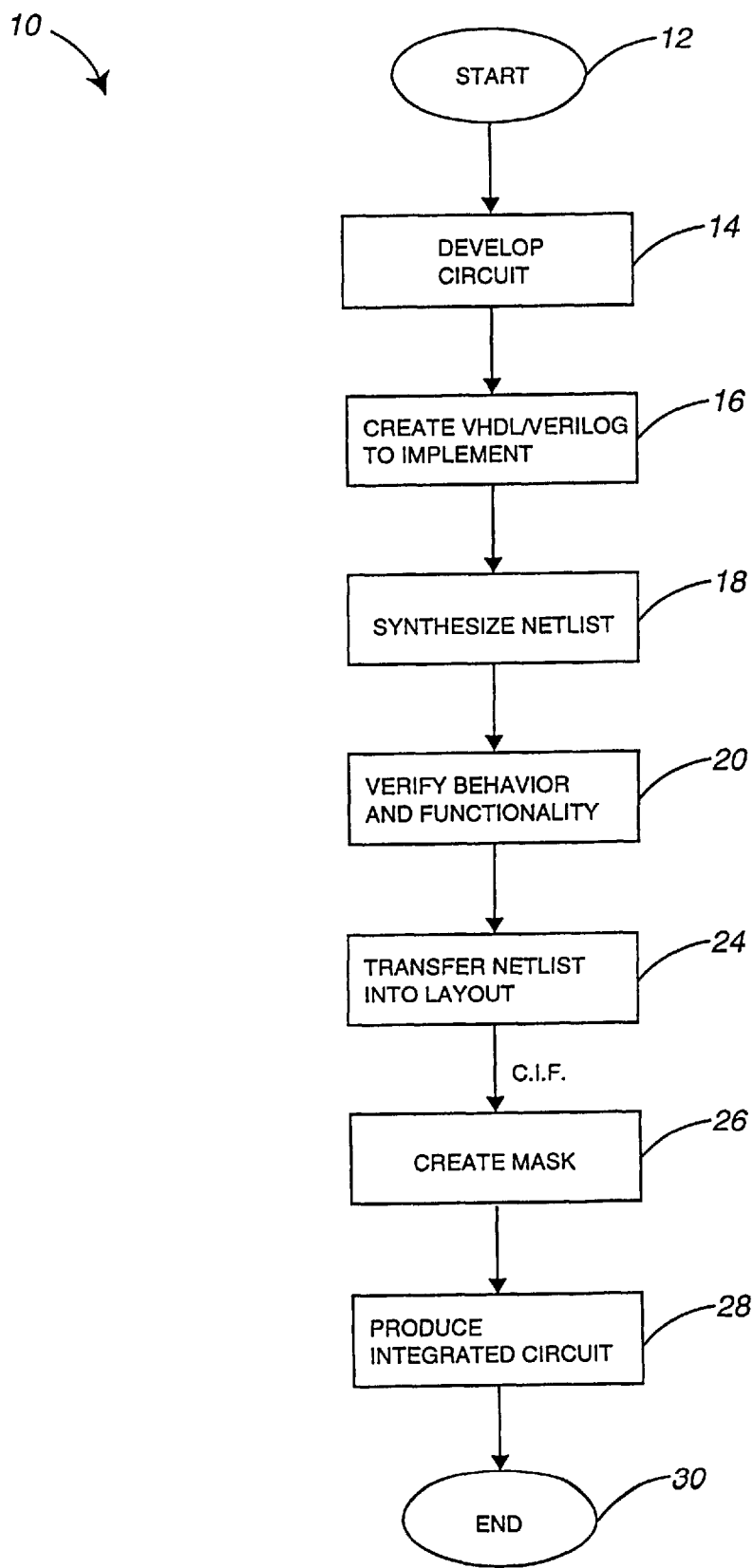
FIG. 1 is a process flow diagram illustrating a prior art process for designing and fabricating integrated circuits (ICs)
Figure 2:
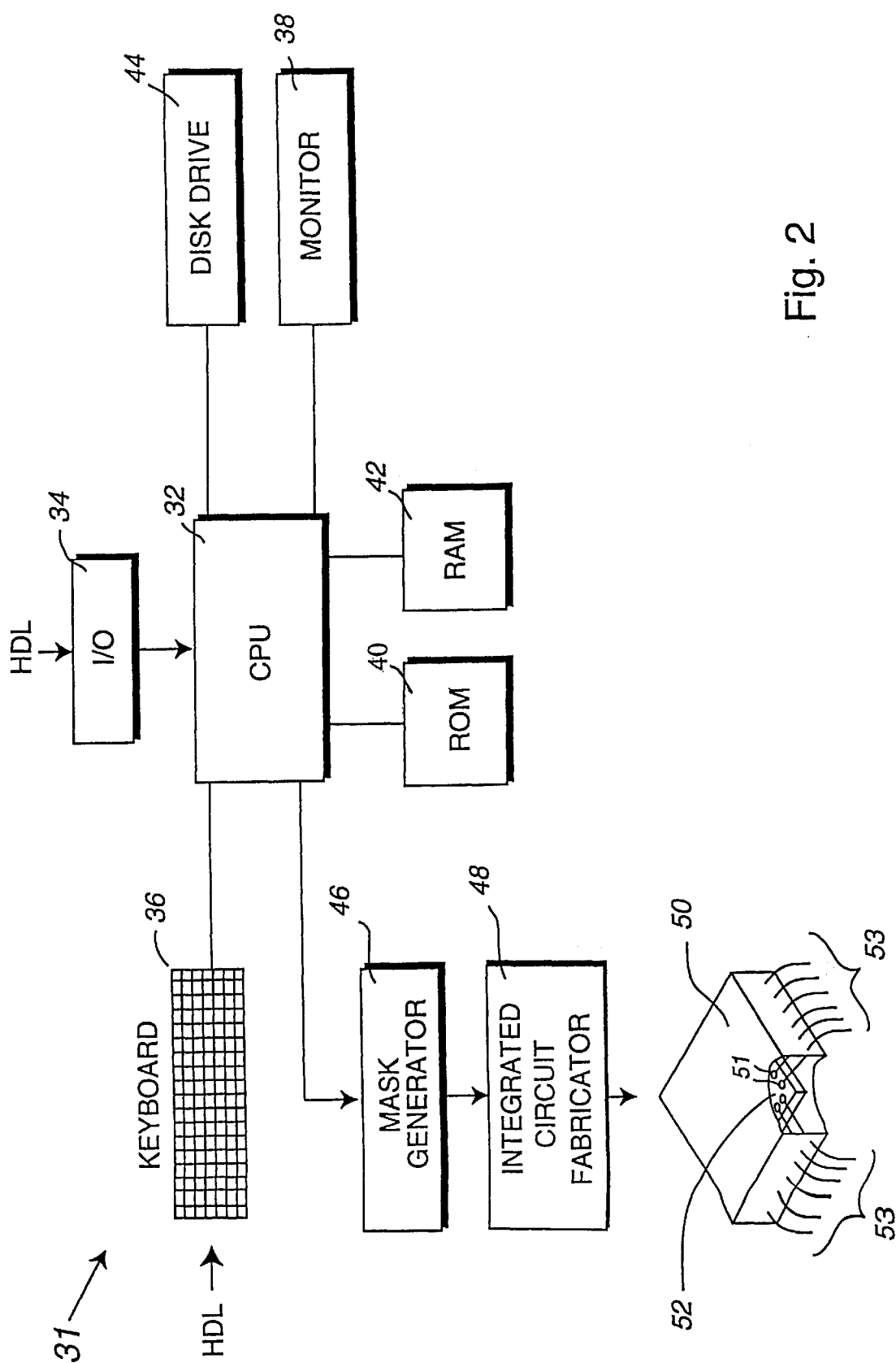
FIG. 2 is a block diagram of a system used to create integrated circuits.

FIG. 1 illustrates a prior art process for producing integrated circuits, and was discussed previously. In FIG. 2, a block diagram of an integrated circuit fabrication system 31 of the present invention is illustrated. The system 31 includes a central processing unit (CPU) 32, an I/O port 34, a keyboard 36, a monitor 38, ROM 40, RAM 42, a disk drive unit 44, a mask generator 46, and an IC fabricator 48. CPU 32 is coupled to I/O port 34 and to a user input device such as keyboard 36. HDL can be received and input into the system 31 through the I/O port 34, the user input device 36 or another input channel such as disk drive 44.

Typically, HDL received through the I/O port 34 comes from another machine (computer). This would be the case, for example, when a netlist is synthesized by another computer. The user input device 36 usually takes the form of a keyboard. It permits the circuit designer to input circuit specifications or to control netlist manipulations performed by the CPU. Again typically, the circuit designer using the input device or keyboard 36 will use a monitor 38 also coupled to the CPU 32.

The system processor 31 is preferably provided with various types of digital storage capacity. As shown in FIG. 2, this digital storage will typically include ROM 40, RAM 42, and a disk drive 44. The disk drive 44 may be used to store HDL received from the I/O ports 34 or the user input device 36 or may be used to enter HDL into the system, and it may store mask generation data created by processes running on the hardware description processor 31 and its CPU 32. The disk drive 44 may be replaced or augmented by other permanent storage devices such as magnetic tape or floppy disks. As noted, an original netlist can be either input through, for example, the I/O port 34 or the user input device 36, or it can be synthesized directly on the system 31.

From the netlist, the system 31 develops mask generating data. This mask generation data can be stored in the digital storage such as the disk drive 44. The mask generator 46 receives the mask generation data from the CPU 32. Alternatively, (not shown) the mask generator 46 may receive mask generation data directly from digital storage such as the disk drive 44. The mask generator 46 may be part of the hardware description processor 31, or it may be a separate device. The mask generation data, or C.I.F., is used by the mask generator 46 to create photolithography masks. These masks will be used in an integrated circuit fabricator 48 to form components of the integrated circuit on a wafer. The mask will be sufficient to create the components on the integrated circuit and the connections between the components. The integrated circuit fabricator 48 includes semiconductor manufacturing equipment such as etchers, chemical vapor deposition (CVD) machines, lithography machines, etc. as is well known to those skilled in semiconductor manufacturing.

The final result of processing by system 31 is a packaged integrated circuit 50. This packaged IC 50 will contain a die 52 created from using the mask created by the mask generator 46. The semiconductor die 52 typically contains a digital integrated circuit and I/O pads 51 for coupling the circuit to several leads 53. The I/O pads can be coupled to the leads 53 in any conventional manner such as by bonding wires.

The layout process of the present invention includes computer implemented processes executing on a digital computer, e.g. the CPU 32 of system 31. These processes are often referred to as "tools", since they fashion a data structure "object" into another form. In particular, a "layout tool" of the present invention includes an "ECO placement tool" which aids in the efficient modification of the netlist in response to Engineering Change Orders (ECOs).

As noted above, a netlist describes a net which, in turn, specifies the components (cells) and their theoretical interconnections but not how they physically laid-out and physically interconnected. In other words, a netlist is a theoretical description of a circuit. To make it a practical description, a layout process determines the placement of cells and the precise routing or wiring connections between pins of various cells.

Figure 3:
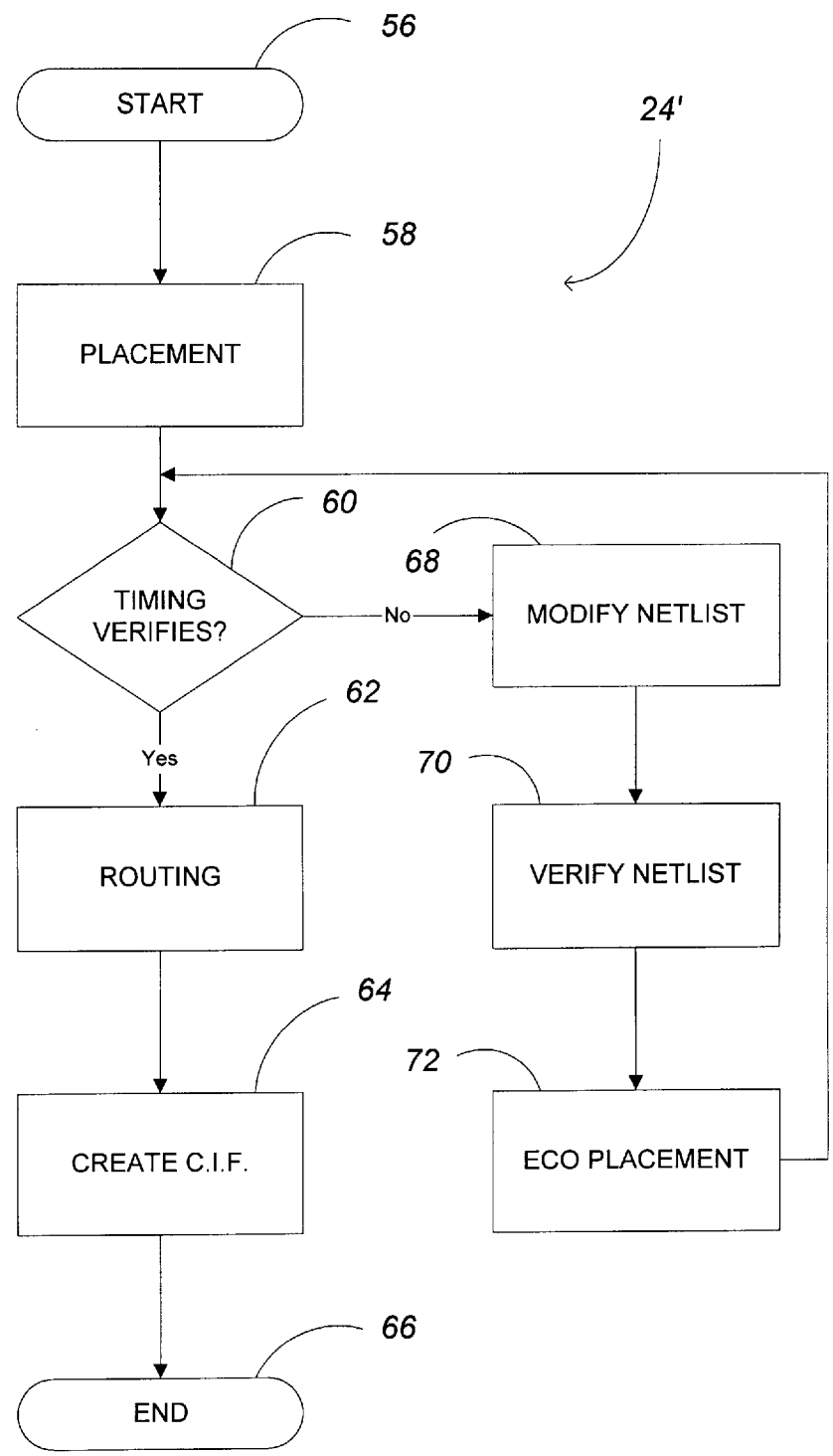
FIG. 3 is a process flow diagram illustrating a layout process in accordance with the present invention.

FIG. 3 illustrates a "layout tool" or process 24' for laying out an integrated circuit in accordance with the present invention. This process 24' replaces the step 24 of the prior art process 10 (see FIG. 1) for fabricating an integrated circuit. Process 24' begins at 56 and, in a step 58, a "placement" process is implemented. This placement process can be any conventional placement process known in the prior art. Next, in a step 60, it is determined whether timing verifies, i.e. whether timing constraints have been met. The various forms of timing constraints will be discussed in greater detail subsequently. If step 60 determines that timing does verify, a "routing" process is executed in step 62. Again, the routing process can be any conventional routing process or tool known to those skilled in the art. The resulting placed and routed circuit is then converted into C.I.F. format in a conventional step 64, and the process is completed at 66.

If step 60 determines that timing does not verify, an Engineering Change Order (ECO) process begins. More specifically, in a step 68 a designer modifies the netlist in order to modify or add one or more cells to achieve the desired timing constraints. Next, in a step 70, the modified netlist is verified. This is very similar to the step 20 of FIG. 1, and is conventional in nature. After the netlist is verified and modified as necessary, the ECO placement process or "ECO placement tool" 72 of the present invention properly places the new and/or modified cells into the placement taking into account timing constraints while minimizing overall net length. Process control is then returned to step 60. In the vast majority of cases, step 60 will now detect that timing constraints have been met, and steps 62–66 are executed. In the small minority of cases where timing constraints have not been meet even after steps 68–72 have been executed, the steps 68–72 can be repeated until the timing constraints are met as detected in step 60.

Figure 4:
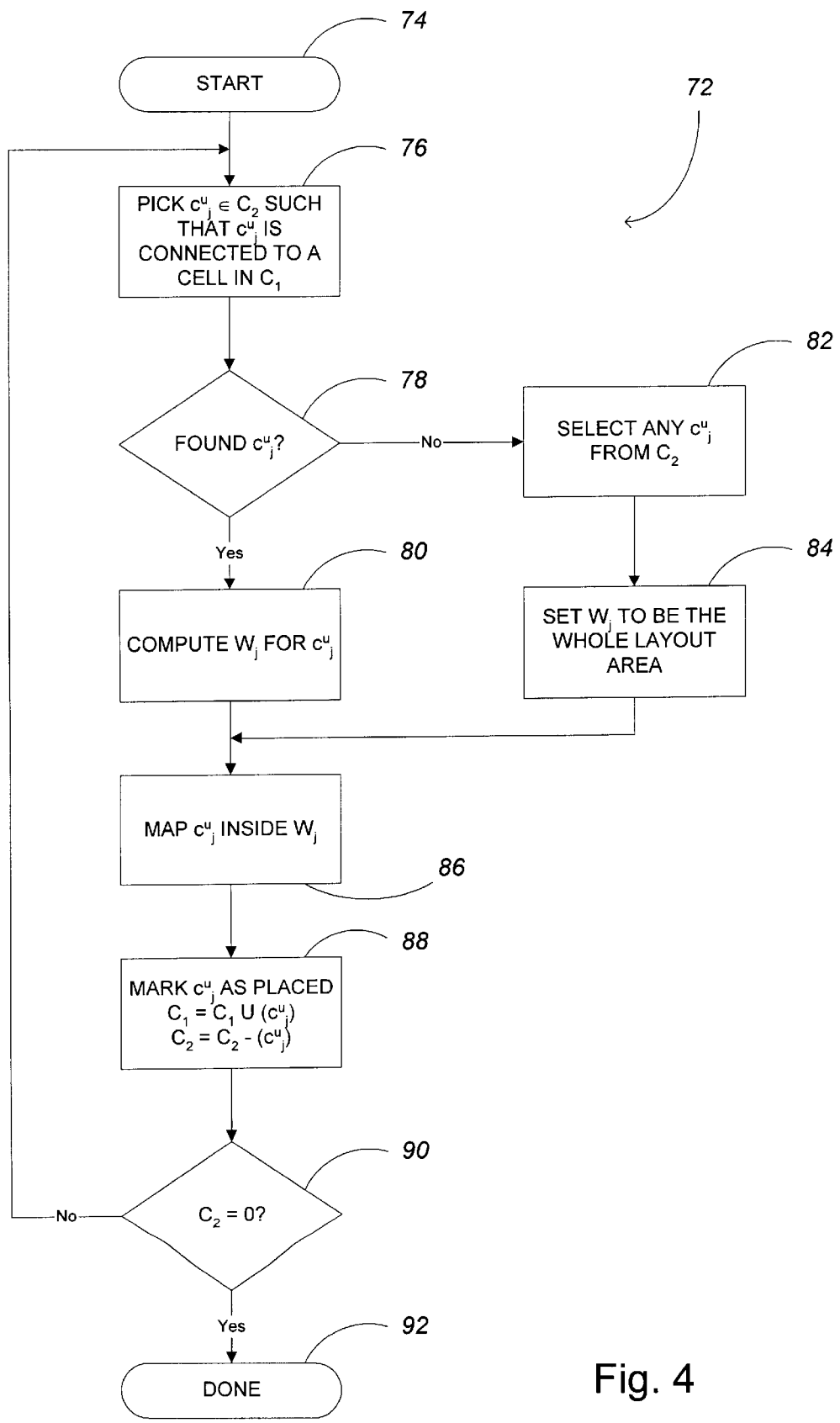
FIG. 4 is a process flow diagram illustrating the "ECO PLACEMENT" step of FIG. 3.

FIG. 4 illustrates the ECO placement process or tool 72 in greater detail. However, before the process 72 is discussed, it will be convenient define certain terminology, conventions, and nomenclature as follows:

DEFINITIONS

Target Window: A "target window" of an unplaced cell "$c''_i$" with respect to all the placed cells "$c^p_j$" is a region $W_i=(l_i, b_i, r_i, t_i)$ on the layout area such that placing $c''_i$ in any location inside $W_i$ will result in a minimum net length of all the nets in $N(c''_i)$. The parameters $(l_i,r_i)$ and $(b_i,t_i)$ are called "x-span" and "y-span", respectively, of the target window.

Bounding Box: A "bounding-box" of a net $N_i \in N$, $B(N_i)$, is defined by the minimum rectangle enclosing all the pins to which the net $N_i$ is connected. The net length of $N_i$, $L(N_i)$, is estimated by half-perimeter length of $B(N_i)$, i.e. two adjacent sides of the bounding box. Therefore, if $L_x(N_i)$ and $L_y(N_i)$ are lengths in x and y directions, respectively, then $L(N_i)=L_x(N_i)+L_y(N_i)$.

Multiset: A "multiset" is, like a set, a collection of elements; however, unlike set, multiset can have multiple occurrences of the same element.

OVERVIEW OF ECO PLACEMENT PROCESS

The timing constraints, as well known to those skilled in the art, are often specified in three different ways: (1) using critical paths; (2) using net weights; and (3) specifying maximum capacitance on nets. A "critical path" is defined by a sequence of "net pins" (i.e. pins of cells that are connected by a net) and net "edges" between the pins. As used herein, an "edge" of a net is the connection between any two pins of that net. The timing constraint is the maximum allowed delay on the critical path. The ECO placement tool 72 of the present invention places modified and/or new cells in a way such that the delay constraints are met. The edges on a path belong to different nets and, to meet the timing constraints, the cells on those nets are to be placed close to each other. During placement, this is achieved by assigning variable weights to nets on a critical path.

If the timing constraints are given using maximum capacitance on nets, the ECO placement tool 72 places the cells in a way such that the wire capacitances on the constrained nets do not exceed the specified maximum limit. This constraint is also handled by assigning higher weights to nets with maximum capacitance constraints. The method of the present invention takes net weights into consideration during ECO placement.

The input to the ECO placement tool 72 is a modified netlist consisting of a set of pre-placed cells $C_1=\{c^p_1, c^p_2, \ldots, c^p_{m1}\}$, a set of new unplaced cells $C_2=\{c''_1, c''_2, \ldots, c''_{m2}\}$, a set of nets $N=\{N_1, N_2, \ldots, N_n\}$ and, associated with each net $N_i$, a weight function $w(N_i)>0$, for $1 \leq i \leq n$. For each net $N_i$, $C(N_i)$ is the set of cells connected by $N_i$. $N(c_j)$ is the set of nets with a pin on cell $c_j$. For each cell $C''_j$, $1 \leq j \leq m_2$, its placement location is determined by using the bounding box of $N(c''_j)$.

In FIG. 4, an ECO placement process 72 in accordance with the present invention begins at 74 and, in a step 76, from the set of unplaced cells $C_2$, we pick a cell $c''_i$ which is connected to at least one placed cell by a net. If step 78 determines that an appropriate cell $c''_i$ has been found, a step 80 computes the target window $W_i$ of that cell. If step 78 determines that no such cell $c''_i$ found, i.e. the set of unplaced cells are disconnected from the rest of placed cells, a cell is randomly picked in a step 82, and the target window $W_i$ is set to the entire layout area, ie. the entire active area of the IC. After the completion of either step 80 or 84, a step 86 maps the cell $c''_i$ within the target window $W_i$. A step 88 marks cell $c''_i$ as "placed", adds it to the set $C_1$, and removes it from the set $C_2$. Step 90 determines whether the set $C_2$ is empty, ie. whether all cells $c''_i$ have been placed. If not, process control is returned to step 76. If all cells $c''_i$ have been placed, the process 72 is completed as indicated at 92.

Figure 5:
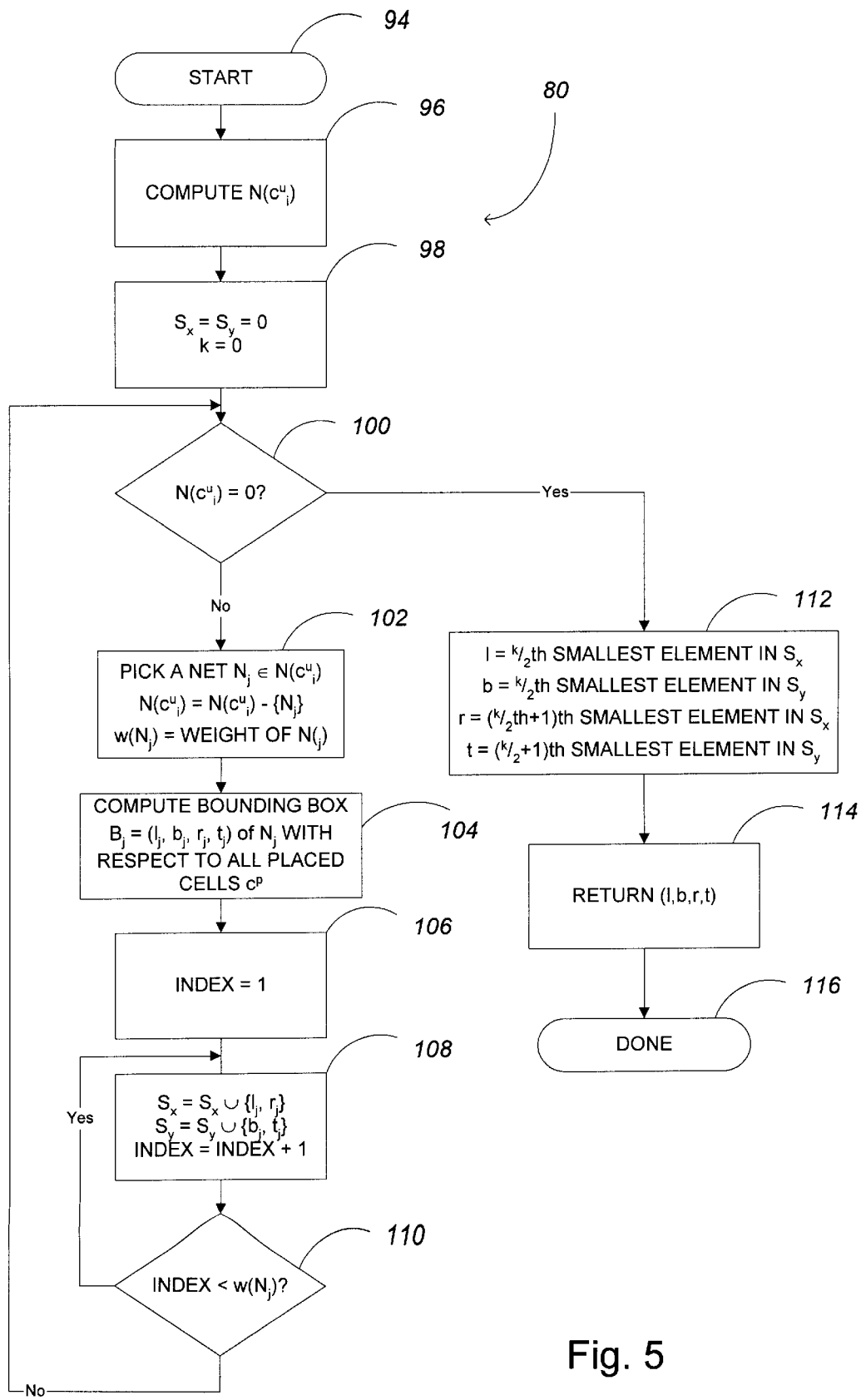
FIG. 5 is a process flow diagram illustrating the "COMPUTE $W_j$" step of FIG. 4.

In FIG. 5, the step 80 (computing a target window) of FIG. 4 is illustrated in greater detail. The present invention utilizes a mathematical model to accomplish this step. For an unplaced cell $c''_i \in C_2$, $N(c''_i)$ is defined as the set of nets with a pin on $c''_i$. A single net $N_j$ is a subset of the set of nets, i.e. a net $N_j \in N(c''_i)$. The net length of $N_j$ can be viewed as a function of the placement location of $c''_i$. In the following descriptions, $L_x(N_j)$ and $L_y(N_j)$ are x-length and y-length functions, respectively for $N_j$.

Figure 6:
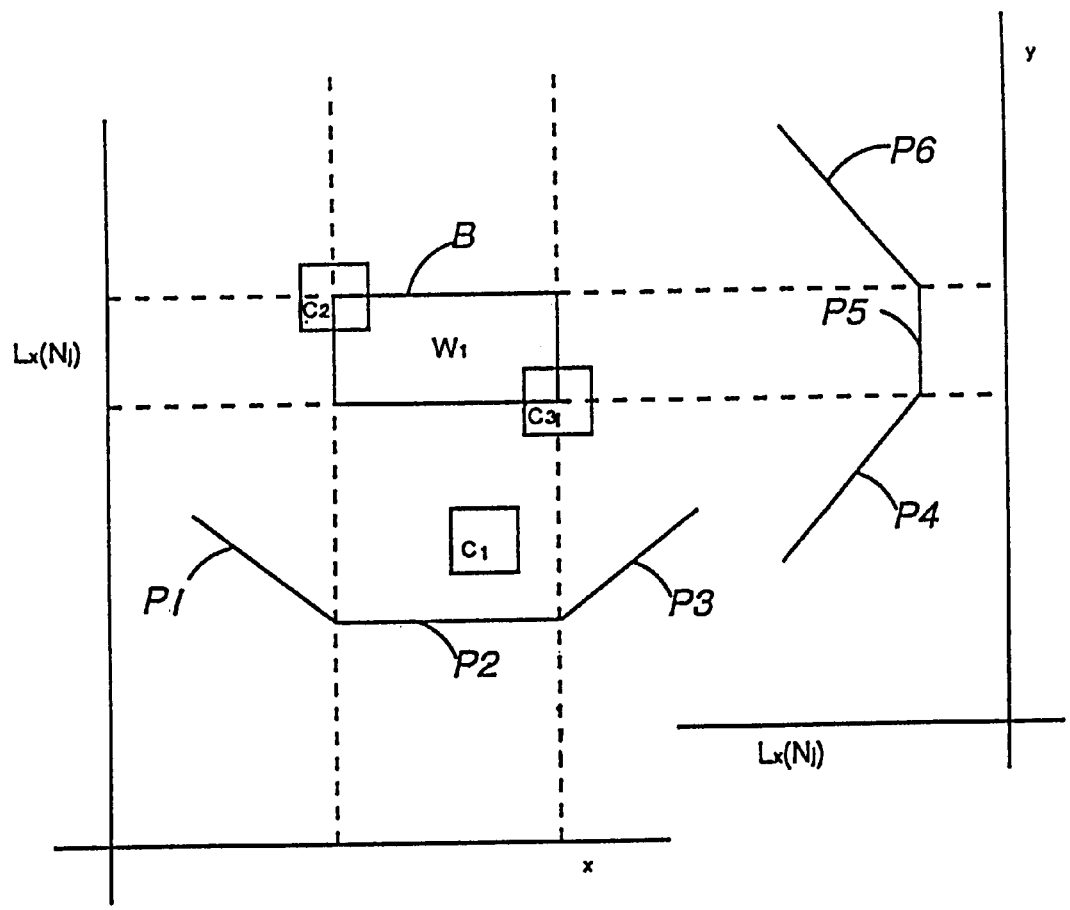
FIG. 6 is a diagram used to illustrate the process of FIG. 5.

FIG. 6 illustrates an example of such functions for net connecting three cells $c_1, c_2$, and $c_3$. Again, these cells represent components of the integrated circuit, and include "pins" that are to be interconnected by a net to form a common potential node. The two functions in the present example are with respect to the placement location of cell $c_1$. It can be seen that the net length will be minimized if $c_1$ is placed within the bounding box "B" enclosing $c_2$ and $c_3$. If $c_1$ is placed in any location outside the bounding box "B", the net length will increase linearly.

These type of functions are known as "piece-wise linear unimodal" functions. The various "pieces" are shown at P1, P2, P3, P4, P5, and P6 in FIG. 6. If, $N_j$ is the net that connects $c_1$, $c_2$, and $c_3$ together, then P1, P2, and P3 collectively define the x-length function $L_x(N_j)$ of $N_j$, and P4, P5, and P6 define the y-length function $L_y(N_j)$ of $N_j$.

As is well known to those skilled in the art, the sum of a set of piece-wise linear unimodal functions is also a piece-wise linear unimodal function. If $L_x(N(c^u_i))$ is the x-length function for all the nets in $N(c^u_i)$, it is easy to see that $L_x(N(c^u_i)) = \Sigma_{N_j \in N(c^u_i)} L_x(N_j)$ and is a piecewise linear unimodal function. The domain of values for which function $L_x(N(c^u_i))$ gives the minimum value, is the x-span of the target window for the cell $c^u_i$. This is also called the domain of minimum of the function. Similarly, the domain of values for which function $L_y(N(c^u_i))$ gives the minimum value is the y-span of the window for the cell $c^u_i$.

For a net $N_{j \in N(c^u_i)}$, if $B_j = (l_j, b_j, r_j, t_j)$ is the bounding box of $N_j$ with respect to all the placed cells, then it can be seen that $(l_j, r_j)$ is the domain of minimum of $L_x(N_j)$, and $(b_j, t_j)$ is the domain of minimum of $L_y(N_j)$. This is due to the fact that if $c^u_i$ is placed anywhere outside $B_j$, the net length of $N_j$ will increase. Therefore, if $c^u_i$ is connected to only $N_j$, then $B_j$ will give us the target window. In case $C^u_i$ is connected to more than one net, we still can use the bounding box of each net to get the target window for $c^u_i$.

Referring again to FIG. 5, the process 80 of the present invention begins at 94 and, in a step 96, $N(c^u_i)$ is computed. Next, in a step 98, the sets $S_x$ and $S_y$ are set to null ("φ"), and the counter "k" is set to zero. A decision step 100 determines if the set $N(c^u_i)$ is null and, if not, a step 102 picks a net $N_j \in N(c^u_i)$, and then removes the selected net from the set $N(c^u_i)$. As noted, the weight $w(N_j)$ of $N_j$ is provided to the process 80. Next, in a step 104, the bounding box B is computed as $B_j = (l_j, b_j, r_j, t_j)$ of net $N_j$ with respect to all placed cells. Next, a step 106 assigns the counter "index" the value of 1, and a step 108 assigns $S_x = S_x \cup \{l_j, r_j\}$ and $S_y = S_y \cup \{b_j, t_j\}$. Step 108 also iterates the counter "index" by one. A decision step 110 determines whether "index" is less than the weight $w(N_j)$ and, if it is, step 108 is repeated until "index" is greater than or equal to the weight $w(N_j)$, at which time process control returns to step 100.

When step 100 determines that set $N(c^u_i)$ is null, i.e. all nets have been removed from the set, a step 112 defines the parameters l, b, r, and t as follows:

l=k/2th smallest element in $S_x$
b=k/2th smallest element in $S_y$
r=(k/2+1)th smallest element in $S_x$
t=(k/2+1)th smallest element in $S_y$ These parameters define the boundaries of the target window $W_i$ of the cell $c^u_i$. More specifically, l, b, r, and t are the left, bottom, right, and top boundaries, respectively, of target window $W_i$. Finally, in a step 114, these parameters l, b, r, and t are returned to be used by the mapping process 86 of FIG. 4.

The process 80 is further illustrated in the procedure listed in TABLE 1, below. This procedure is written as "pseudo code", as will be appreciated by those skilled in the art. Actual software or "code" implementing the pseudo code is preferably provided as a callable function TARGET_WINDOW during the implementation of the process of the present invention. The sets $S_x$ and $S_y$ are multisets and are used to store the x- and y-values of the bounding box of different nets.

TABLE 1

PROCEDURE TARGET WINDOW procedure TARGET_WINDOW($c^u_i$)
1. Compute $N(c^u_i)$.
2. Let $S_x$ = φ; $S_y$ = φ.
3. Let $k = 0$
4. for each net $N_j \in N(c^u_i)$ do
    4.1. compute the bounding box $B_j = (l_j, b_j, r_j, t_j)$ of net $N_j$ with respect to all placed cells.
    4.2. Let $w(N_j)$ be the weight of $N_j$.
    4.3. for $i = 1$ to $w(N_j)$ do
        4.3.1. $S_x = S_x \cup \{l_j, r_j\}$
        4.3.2. $S_y = S_y \cup \{b_j, t_j\}$
    4.4. $k = k + 2*w(N_j)$
5. Let $l = k/2$th smallest element in $S_x$
   Let $b = k/2$th smallest element in $S_y$
   Let $r = (k/2 + 1)$th smallest element in $S_x$
   Let $t = (k/2 + 1)$th smallest element in $S_y$
6. return $(l, b, r, t)$;

Note that the value of k in procedure TARGET_WINDOW is the total number of elements in $S_x$ and $S_y$ and is always even. It will be appreciated by those skilled in the art that the k/2th and (k/2+1)th values in $S_x$ give the x-span of the target window. Similarly, the k/2th and (k/2+1)th values in $S_y$ give the y-span of the target window. Since the timing constraints are provided in the form of net weights, this procedure satisfies the timing requirements by minimizing weighted net length during the target window computation.

The computational complexity of the procedure is dominated by step 4 (i.e. the iterative loop comprising steps 4.1–4.4) of the procedure TARGET_WINDOW of Table 1, the complexity being designated as O(n), where n is the total nets connected to the given cell. As is well known to those skilled in the art, "O" is used to specify the order of time complexity in the execution of procedures, such as the pseudo-code procedure listed above. In this particular instance, O(n) simply indicates that the loop of step 4 is executed "n" times. The loop of step 4.3 is executed $w(N_j)$ times that is, in the worst case, the time complexity of this loop is O(k), where k is the maximum weight of a net. Therefore the overall time complexity of the procedure is O(kn), where k is the maximum weight of a net and n is the maximum number of net connected to a cell.

Since weights are provided to the procedure and are set according to the timing constraints as mentioned previously, we can assume the weights to be constant. Thus the time complexity of the procedure is O(n). In practice, on the average each cell is connected to at most 5 or 6 nets. Therefore, the procedure of the present invention calculates the target window of a cell very quickly and efficiently.

With reference again to FIG. 4, once the target window is found in step 80 by the procedure TARGET_WINDOW, the cell is placed ("mapped") inside the target window in a step 86. The actual mapping step will depend upon the IC technology being used, as will be appreciated by those skilled in the art of custom and semi-custom IC fabrication.

Figure 7A:
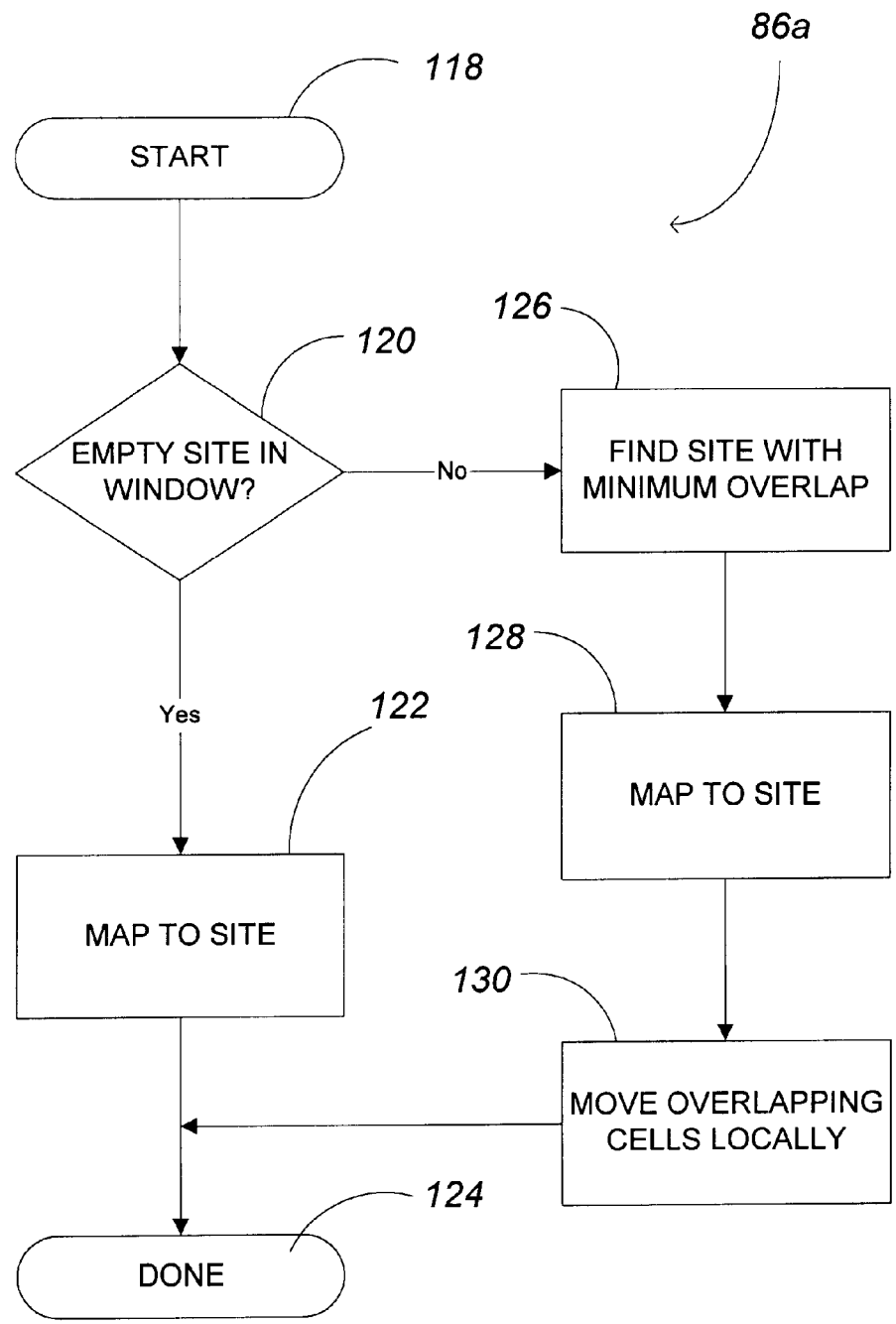
FIG. 7a is a process flow diagram of the "MAP" step of FIG. 4 for gate array designs.

In FIG. 7a, a "mapping" process 86a suitable for gate array IC designs is illustrated in the form of a process flow diagram. The process 86a begins at 118 and, in a step 120, it is determined if there is an empty "site" in the window. As is well known to those skilled in the art, in gate array designs "sites" are defined within the layout area for each cell. A cell can be only placed on the sites that were defined for it. If there is an empty site, the cell is mapped to the site in a step 122, and the process 86a is completed at 124. If there is not an empty site, a step 126 finds a site with the minimum of overlap from the cell to be placed. Next, the cell is placed at the minimum overlap site in a step 128, and overlapped cells are moved locally until they no longer overlap. The process is then completed at 124.

Figure 7B:
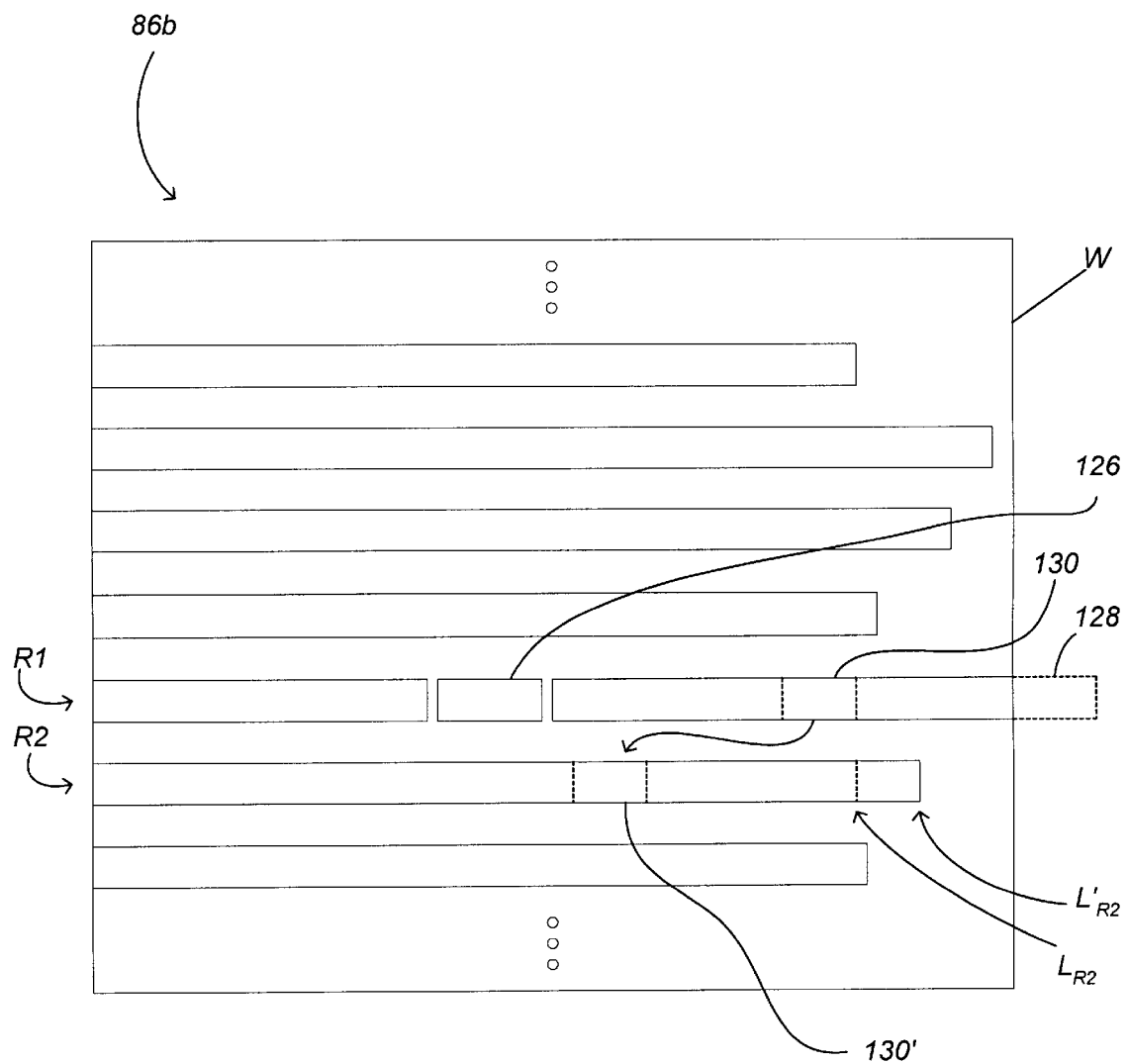
FIG. 7b is a process flow diagram of the "MAP" step of FIG. 4 for standard cell designs.

In FIG. 7b, a "mapping process" 86b suitable for standard cell IC designs is illustrated graphically. In case of standard cell technology, a cell to be placed by step 86 is "mapped" into a row within the window, and all the cells in that window are "pushed" to remove any overlap. In case the row length becomes greater than other row lengths, other cells that are not in the critical path are moved to make the row length shorter. For example, if a cell 126 is "mapped" into a row R1, that row could extend beyond the window W by an amount 128. Instead of allowing the row R1 to extend beyond the window W, a cell 130 (not in the critical path) is removed from the row R1 and is placed in an appropriate position 130' in a row R2. This causes the length of row R2 to increase from $L_{R2}$ to $L'_{R2}$, which is still within the window W.

While this invention has been described in terms of several preferred embodiments, there are alterations, permutations, and equivalents which fall within the scope of this invention. It should also be noted that there are may alternative ways of implementing both the process and apparatus of the present invention. It is therefore intended that the following appended claims includes all such alterations, permutations, and equivalents as fall within the true spirit and scope of the present invention.

We claim:

1. A method for laying out an integrated circuit design based upon a netlist provided by a behavioral synthesis tool, said method comprising the steps of:

A) receiving into a computer readable memory said netlist provided by said behavioral synthesis tool specifying cells and cell interconnections satisfying constraints of said integrated circuit design;

B) placing cells specified by said netlist in a layout area in a placement step, said cells including pins that are interconnected by nets;

C) verifying timing constraints in a timing verification step of said placed cells in said layout area, such that said timing verification step accounts for an allowed delay on a critical path defined by a sequence of said pins that are interconnected by said nets; and D) if said timing verification step indicates that timing does not verify in that said timing constraints are not within certain tolerance:

(a) modifying said netlist pursuant to an engineering change order (ECO), said netlist reflecting a change in said placed cells that include pins that are interconnected by nets; and (b) making an ECO placement of at least one cell into said layout area that comprises said placed cells, the making of said ECO placement being configured to meet said timing constraints that are verified in the timing verification step that accounts for said allowed delay on said critical path, and said placement of said at least one cell being performed while adjusting any affected nets of said netlist, the placement comprising the steps of:

(1) determining a target window said layout area for the placement of said picked cell, said target window being a subset of said layout area, said target window representing the portion of the integrated circuit layout area that will be modified to implement said ECO;

(2) picking an unplaced cell from a set of unplaced cells to be a picked cell;

mapping said picked cell inside said target window;

(4) removing said picked cell from said set of unplaced cells;

(5) optimizing the placement of said picked cell by analyzing said picked cell within said target window with respect to said placed cells, and modifying said placement of said picked cell with respect to said placed cells if modifying said placement of said picked cell improves timing; and (6) repeating steps (1)–(5) until said set of unplaced cells is empty, whereby said cell layout is modified to represent said ECO without having to entirely recreate said cell layout; and (E) repeating steps (C) and (D) until said timing constraints are met within said certain tolerance.

2. A method as recited in claim 1 wherein said step of determining said target window involves determining a minimum bounding box that encloses pins connected by nets of cells within the set of unplaced cells.

3. A method as recited in claim 2 wherein said step of determining said target window further involves using weights assigned said nets of said set of unplaced cells, said weights being related to timing constraints of said integrated circuit design.

4. A method as recited in claim 3 wherein said mapping step for a gate array includes the steps of:

mapping said cell to an empty site in said target window, if one exists; and if no empty site exists in said target window, mapping said cell to a site in said window that would exhibit a minimum of overlap with adjacent cells, and moving any overlapped adjacent cells locally within the layout area until the overlap has been eliminated.

5. A method as recited in claim 3 wherein said mapping step for a standard cell includes the steps of:

mapping said cell to a row of cells within said window;

pushing any cells in that row to remove any overlap; and if said row no longer fits within the target window, removing a cell from said row and placing it in another row.

6. A method for making an integrated circuit comprising the steps of:

(A) creating a hardware description language (HDL) description of the functionality of said integrated circuit;

(B) synthesizing a netlist from said HDL description;

(C) laying out a design of said integrated circuit by:

(a) placing cells specified by said netlist in a layout area in a placement step, said cells including pins that arm interconnected by nets;

(b) verifying timing constraints in a timing verification step of said placed cells in said layout area, such that said timing verification step accounts for an allowed delay on a critical path defined by a sequence of said pins that are interconnected by said nets;

(c) if said timing verification step indicates that timing does not verify in that said timing constraints are not within a certain tolerance:

(i) modifying said netlist pursuant to an engineering change order (ECO), said netlist reflecting a change in said placed cells that include pins that are interconnected by nets; and (ii) making an ECO placement of at least one cell into said layout area that comprises said placed cells, the making of said ECO placement being configured to meet said timing constraints that are verified in the timing verification step that accounts for said allowed delay on said critical path, and said placement of said at least one cell being performed while adjusting any affected nets of said netlist, the placement comprising the steps of:

(1) determining a target window within said layout area for the placement of said picked cell, said target window being a subset of said layout area, said target window resenting that portion of the integrated circuit layout area that will be modified to implement said ECO:

(2) picking an unplaced cell from a set of unplaced cells to be a picked cell;

(3) mapping said picked cell inside said target window;

(4) removing said picked cell from said set of unplaced cells;

(5) optimizing the placement of said picked cell by analyzing said picked cell within said target window with respect to said placed cells, and modifying said placement of said picked cell with respect to said placed cells if modifying said placement of said picked cell improved timing; and (6) repeating steps (1)–(5) until said set of unplaced cells is empty, whereby said cell layout is modified to represent said ECO without hat to entirely recreate said cell layout; and (d) repeating steps (b) and (c) until said timing constraints are met within said certain tolerance;

(e) routing between the placed cells in said layout area; and (f) creating a mask layout description from said placed and routed cells;

(D) creating at least one mask from said mask layout description; and (E) producing at least one integrated circuit utilizing said at least one mask.

7. A method as recited in claim 6 wherein said step of determining said target window involves determining a minimum bounding box that encloses pins connected by nets of cells within the set of unplaced cells.

8. A method as recited in claim 7 wherein said step of determining said target window further involves using weights assigned said nets of said set of unplaced cells, said weights being related to timing constraints of said integrated circuit design.

9. A method as recited in claim 8 wherein said mapping step for a gate array includes the steps of:

mapping said cell to an empty site in said target window, if one exists; and if no empty site exists in said target window, mapping said cell to a site in said window that would exhibit a minimum of overlap with adjacent cells, and moving any overlapped adjacent cells locally within the layout area until the overlap has been eliminated.

10. A method as recited in claim 8 wherein said mapping step for a standard cell includes the steps of:

mapping said cell to a row of cells within said window; pushing any cells in that row to remove any overlap; and if said row no longer fits within the target window, removing a cell from said row and placing it in another row.

11. An integrated circuit layout tool comprising:

a computer system including a central processing unit (CPU) and computer readable memory coupled to said CPU;

(A) means for receiving into memory a netlist describing an integrated circuit design;

(B) means for placing cells specified by said netlist in a layout area of said integrated circuit design, said cells including pins that are interconnected by nets;

(C) means for verifying timing constraints of said placed cells in said layout area, such that said means for verifying timing constraints accounts for an allowed delay on a critical path defined by a sequence of said pins that are interconnected by said nets; and (D) if said timing constraints are not verified by said means for verifying timing constraints to be within a certain tolerance, then;

(a) means for modifying said netlist pursuant to an engineering change order (ECO) said netlist reflecting a change in said placed cells that include pins that are interconnected by nets; and (b) means for making an ECO placement of at least one cell into said layout area that includes said placed cells, the means for making an ECO placement being configured to meet said timing constraints that are verified by said means for verifying timing constraints which accounts for said allowed delay on said critical, path and said placement of said at least one cell being performed while adjusting any affected nets as specified by said netlist, the means for making an ECO placement comprising:

(1) means for determining a target window within said layout area for the placement of said picked cell, said target window being a subset of said layout area, said target window representing that portion of the ingrated circuit layout area will be modified to implement said ECO;

(2) means for picking an unplaced cell from a set of unplaced cells to be a picked cell;

(3) means for mapping said picked cell inside said target window;

(4) means for removing said picked cell from said set of unplaced cells;

(5) means for optimizing the placement of said picked cell by analyzing said picked cell within said target window with respect to said placed cells, and modifying said placement of said picked cell with respect to said placed cells if modifying said placement of said picked cell improves timing; and (6) means for repeating steps (1)–(5) until said set of placed cells is empty, whereby said cell layout is modified to represent said ECO without having to entirely recreate said cell layout; and (E) repeating steps (a) and (b) until said timing constraints are met within said certain tolerance.

12. A method as recited in claim 11 wherein said means for determining said target window utilizes a minimum bounding box that encloses pins connected by nets of cells within the set of unplaced cells.

13. An integrated layout tool as recited in claim 12 wherein said means for determining said target window further utilizes weights assigned said nets of said set of unplaced cells, said weights being related to timing constraints of said integrated circuit design.

14. An intergrated layout tool as recited in claim 13 wherein means for mapping for a gate array includes the steps of:

means for mapping said cell to an empty site in said target window, if one exists and, if not, means for mapping said cell to a site in said window that would exhibit a minimum of overlap with adjacent cells, and means for moving any overlapped adjacent cells locally within the layout area until the overlap has been eliminated.

15. An integrated circuit layout tool as recited in claim 13 wherein said means for mapping for a standard cell includes the steps of:

means for mapping said cell to a row of cells within said window;

means for pushing any cells in that row to remove any overlap; and if said row no longer fits within the target window, means for removing a cell from said row and placing it in another row.

16. A method for laying out an integrated circuit design based upon a netlist provided by a behavioral synthesis tool, said method comprising:

(A) generating said netlist by said behavioral synthesis tool specifying cells and cell interconnections satisfying constraints of said integrated circuit design, said cells having pins that are interconnected by nets;

(B) placing cells specified by said netlist in a layout area in a placement step;

(C) verifying timing constraints in a timing verification step of said placed cells in said layout area; and (D) if said timing verification step indicates that timing does not verify in that said timing constraints are not wit a certain tolerance;

(a) modifying said netlist pursuant to an engineering change order (ECO); and (b) making an ECO placement of at least one cell into said layout area based upon said timing constraints while adjusting any affected nets as specified by said netlist said ECO placement comprising:

(i) picking an unplaced cell from a set of unplaced cells to be a picked cell;

(ii) determining a target window within said layout area for the placement of said picked cell;

(iii) mapping said picked cell inside said target window;

(iv) removing said picked cell from said set of unplaced cells; and (v) repeating steps (i)–(iv) until said set of unplaced cells is empty;

(E) repeating steps (a) and (b) until said timing constraints are met within said certain tolerance.

17. A method as recited in claim 16, wherein said step of determining said target window involves determining a minimum bounding box that encloses pins connected by nets of cells within the set of unplaced cells.

18. A method as recited in claim 17 wherein said step of determining said target window further involves using weights assigned said nets of said set of unplaced cells, said weights being related to timing constraints of said integrated circuit design.

19. A method as recited in claim 18 wherein said mapping step for a gate array includes the steps of:

mapping said cell to an empty site in said target window, if one exists; and if no empty site exists in said target window, mapping said cell to a site in said window that would exhibit a minimum of overlap with adjacent cells, and moving any overlapped adjacent cells locally within the layout area until the overlap has been eliminated.

20. A method as recited in claim 18 wherein said mapping step for a standard cell includes the steps of:

mapping said cell to a row of cells within said window;

pushing any cells in that row to remove any overlap; and if said row no longer fits within the target window, removing a cell from said row and placing it in another row.

21. A computer readable medium storing a computer program suitable for laying out an integrated circuit design, said computer program comprising computer executable instructions for:

(A) receiving into memory a netlist specifying cells and cell interconnections satisfying constraints of said integrated circuit design, said cells having pins that are interconnected by nets;

(B) placing said cells specified by said netlist into a layout that is a representation of a physical layout area of said integrated circuit design;

(C) verifying timing constraints in a timing verification step of said placed cells in said layout area; and (D) if said timing verification step indicates that timing does not verify in that said timing constraints are not within a certain tolerance:

(a) modifying said netlist pursuant to an engineering change order (ECO), said ECO representing an incremental change to said integrated circuit that is intended to bring said integrated circuit closer to said timing constraints; and (b) making an ECO placement of at least one cell into said layout area by:

(1) determining a target window within said layout area for the placement of said picked cell, said target window being a subset of said layout area, said target window representing that portion of the integrated circuit layout area that will be modified to implement said ECO;

(2) picking an unplaced cell from a set of unplaced cells to be a picked cell;

(3) mapping said picked cell inside said target window;

(4) removing said picked cell from said set of unplaced cells;

(5) optimizing the placement of said picked cell by analyzing said picked cell within said target window with respect to said placed cells, and modifying said placement of said picked cell with respect to said placed cells if modifying said placement of said picked cell improves timing; and (6) repeating steps (1)–(5) until said set of unplaced cells is empty, whereby said cell layout is modified to represent said ECO without having to entirely recreate said cell layout, (E) repeating execution of (C) and (D) until said timing constraints are met within said certain tolerance.

* * * * *